US007039062B1

(12) United States Patent
Taddiken

(10) Patent No.: US 7,039,062 B1
(45) Date of Patent: May 2, 2006

(54) SYSTEM AND METHOD FOR PULSED CABLE TELEPHONY

(75) Inventor: Albert H. Taddiken, Farmersville, TX (US)

(73) Assignee: Microtune (Texas) L.P., Plano, TX (US)

(*) Notice: Subject to any disclaimer, the term of this patent is extended or adjusted under 35 U.S.C. 154(b) by 0 days.

(21) Appl. No.: 09/461,778

(22) Filed: Dec. 15, 1999

(51) Int. Cl.
H04L 12/43 (2006.01)

(52) U.S. Cl. ............ 370/442; 370/458; 379/322; 379/413

(58) Field of Classification Search ........... 370/216, 370/337, 347, 395.4, 395.42, 395.5, 442, 370/458, 464–466, 469, 485–487, 493, 498; 379/102.04, 322, 413; 725/129, 130
See application file for complete search history.

(56) References Cited

U.S. PATENT DOCUMENTS

| 4,748,626 | A | | 5/1988 | Wong | |
|---|---|---|---|---|---|
| 5,175,729 | A | * | 12/1992 | Borras et al. | 370/345 |
| 5,563,545 | A | | 10/1996 | Scheinberg | |
| 5,717,713 | A | * | 2/1998 | Natali | 370/342 |
| 5,729,824 | A | * | 3/1998 | O'Neil et al. | 725/106 |
| 5,781,844 | A | * | 7/1998 | Spriester et al. | 725/149 |
| 5,847,612 | A | * | 12/1998 | Birleson | 455/260 |
| 5,920,233 | A | * | 7/1999 | Denny | 331/14 |
| 5,953,318 | A | * | 9/1999 | Nattkemper et al. | 370/236 |
| 6,005,861 | A | * | 12/1999 | Humpleman | 370/352 |
| 6,272,209 | B1 | * | 8/2001 | Bridger et al. | 379/27.01 |
| 6,393,105 | B1 | * | 5/2002 | Beveridge | 379/56.2 |
| 6,546,016 | B1 | * | 4/2003 | Gerszberg et al. | 370/401 |
| 6,611,537 | B1 | * | 8/2003 | Edens et al. | 370/503 |
| 6,785,564 | B1 | * | 8/2004 | Quigley et al. | 455/574 |

FOREIGN PATENT DOCUMENTS

WO    WO 99/31811    *  6/1999
WO    WO 99 31811 A      6/1999

(Continued)

OTHER PUBLICATIONS

Razavi, Behzad, Kwing F. Lee, Ran-Hong Yan, and Robert G. Swartz. "A 3-GHz 25-mW CMOS Phase-Locked Loop." 1994 Symposium on VLSI Circuits Digest of Technical Papers. (1994). 131-132.

(Continued)

Primary Examiner—John Pezzlo
Assistant Examiner—Ahmed Elallam
(74) Attorney, Agent, or Firm—Fulbright&Jaworski LLP

(57) ABSTRACT

A cable receiver system and method which utilizes the combination of time-division multiplexing ("TDM") and a fast-acquisition-time tuner to enable on/off pulsing of the tuner, thereby resulting in substantially reduced power consumption by the tuner. The tuner may be pulsed on during the allocated time slot to receive the allocated portion of the signal, and then pulsed off the remainder of the time. The tuner generally requires a fast signal acquisition time compared to the received signal's frame rate so that the tuner does not use up an excess amount of the frame outside of the proper time slot when locking in the received signal. The TDM technique permits more efficient use of the high bandwidth network by multiplexing the relatively low bandwidth voice signals. In addition, the implementation of a fast-acquisition-time tuner in the NIU of a cable system permits the tuner to be pulsed off for a substantial amount of the time between the allocated time slots. Finally, the pulsing of the tuner substantially reduces power consumption by the receiver in an NIU, thus economically enabling the use of a telephony cable system that can operate during a power outage.

40 Claims, 2 Drawing Sheets

FOREIGN PATENT DOCUMENTS

WO      WO 99 34541 A     7/1999
WO      WO 99/34541     *   8/1999

OTHER PUBLICATIONS

Racanelli, Marco et al. "RF BiCMOS Technology for Highly Integrated Wireless Systems." 1999 IEEE RFIC Symposium. (1999).

Boutin, Noel. "Complex Signals: Part 1" RF Featured Technology. (Dec. 1989). 27-75.

Lovelace, David, et al. "Silicon Upconverter RF IC Simplifies Cable Modem Designs" Microwaves & RF (Mar. 1997). 136-142.

Abidi, Asad A. "Direct-Conversion Radio Transceivers for Digital Communications." IEEE International Solid-State Circuits Conference. (1995). 186-187; 363-364.

* cited by examiner

| | CELLULAR-GSM | CELLULAR-D-AMPS | CABLE TELEPHONY |
|---|---|---|---|
| CHANNEL BW | 200kHz | 30kHz | 375kHz |
| FRAME | 4.615 msec | 40 msec | 40 msec |
| SLOTS/FRAME | 8 | 3 | 64 |
| MODULATION | GMSK | π/4-DQPSK | 256-QAM |
| TOTAL BIT RATE | 270kb/s | 48kb/s | 2690kb/s |
| BITS/Hz | 1.35 | 1.6 | 7.2 |
| BIT RATE/SLOT | 34kb/s | 16kb/s | 42kb/s |
| NET BIT RATE | 13kb/s | 8kb/s | 13kb/s |
| POWER SAVED* | 65.8% | 64.1% | 95.9% |

* ASSUMING 1 msec OVERHEAD (LOCK TIME)

SYSTEM AND METHOD FOR PULSED CABLE TELEPHONY

BACKGROUND

Traditionally, local phone service has been provided to subscribers by a telephony service provider, such as a Regional Bell Operating Company ("RBOC"), via the Public Switched Telephone Network ("PSTN"). Because of recent technological developments and changes in regulatory laws, other types of entities, such as wireless service providers and cable service providers, now have an opportunity to compete with or supplant the traditional telephone company as the primary local phone service provider for many subscribers. As used herein, the terms "subscriber" or "customer" are defined as a user of cable services.

For a cable service provider to provide telephony service to a subscriber, the cable system generally requires a device known as a Network Interface Unit on or near the subscriber's premises to function as the interface between the subscriber's telephony equipment and the service provider's cable plant. As used herein when distinguishing the service provider's equipment from the subscriber's equipment, the term "cable plant" includes the cable service provider's transmission equipment and the Hybrid Fiber Coax ("HFC") network used to propagate the cable service to the subscriber. As used herein, the term "Network Interface Unit" (or "NIU") is defined to be the equipment which is used to interface between a subscriber's telephony equipment and the cable plant. The actual device that performs this interface function may be called by other names, or may perform additional functions. For example, the device may be called a Network Interface Device ("NID"), cable modem ("CM"), customer access unit, or wallbox. As another example, the device may perform other functions such as housing the ground block, providing a splitter, or providing an amplifier.

In order for a cable service provider to function as the primary local telephony service for a subscriber, however, the service provider must generally power the NIU through the cable so that guaranteed Quality of Service ("QoS") is maintained even during a power outage at the subscriber's premises, in much the same way that the traditional telephone company powers a subscriber's phone. This capability is commonly known as "Lifeline Support" since it provides the subscriber with the ability to dial emergency services even during a power outage. The cable telephony service provider generally implements this feature by powering the NIU from storage batteries within the cable plant. Generally, it follows that the lower the average power dissipation of the NIU, the smaller the storage batteries for a given Lifeline Support duration, and therefore the lower the cost of offering that service, other factors being equal. Alternatively, the Lifeline Support duration may be made longer if the capacity of the storage batteries is kept constant. As used herein, the term "external power" is defined as power received from a source other than through the cable input to the NIU.

Accordingly, there is a need in the prior art for a NIU with a low average power dissipation to economically enable the provision of Lifeline Support service via cable telephony.

SUMMARY OF THE INVENTION

These and other objects, features and technical advantages are achieved by a cable receiver system and method which utilizes the combination of time-division multiplexing ("TDM") and a fast-acquisition-time tuner to enable on/off pulsing of the tuner, thereby resulting in substantially reduced power consumption by the tuner. Generally, by using TDM techniques that have been used in other fields, such as cellular phone technology, the tuner in an NIU may be pulsed on during the proper time slot to receive the allocated portion of the signal, and then pulsed off the remainder of the time. As explained in more detail below, the tuner generally requires a fast signal acquisition time compared to the received signal's frame rate so that the tuner does not use up an excessive amount of the frame outside of the allocated time slot when locking in the received signal.

In accordance with a preferred embodiment of the present invention, a cable telephony NIU comprises a radio frequency (RF) cable input for receiving RF telephony signals, wherein the telephony signals comprise a time division multiplexed (TDM) RF signal having a frame rate, an RF tuner for processing the TDM RF signal, wherein the tuner has an acquisition time of less than half of the frame rate, and a voice telephony device compatible output for providing an output from the tuner to a telephony device.

In accordance with another preferred embodiment of the present invention, a method for processing cable telephony signals comprises receiving a TDM RF cable signal from a cable input, the TDM RF signal comprising frames having time slots, pulsing on a fast acquisition time tuner for an allocated time slot in each of the frames, the tuner for processing the TDM RF signal, and pulsing off the tuner for substantially the remainder of time in each of the frames, the frames having a frame rate.

In accordance with yet another preferred embodiment of the present invention, a method for providing lifeline support in cable telephony comprises receiving electrical power from an external power source, receiving a continuous wave (CW) RF cable signal from a cable input, processing the CW RF signal with an RF tuner, losing power from the external power source, switching to receive the electrical power from the cable input, receiving a TDM RF telephony signal in place of the CW RF signal, the TDM RF signal comprising frames having time slots, and pulsing the tuner on during an allocated time slot in each of the frames and off for substantially the remainder of each of the frames.

An advantage of an embodiment of the present invention is that the TDM technique permits more efficient use of the high bandwidth network by multiplexing the relatively low bandwidth voice signals.

Another advantage of an embodiment of the present invention is that the implementation of a fast-acquisition-time tuner in the NIU of a cable system permits the tuner to be pulsed off for a substantial amount of the time between the allocated time slots.

Yet another advantage of an embodiment of the present invention is that the pulsing of the tuner substantially reduces power consumption by the receiver in an NIU, thus economically enabling the use of a telephony cable system that can operate during a power outage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
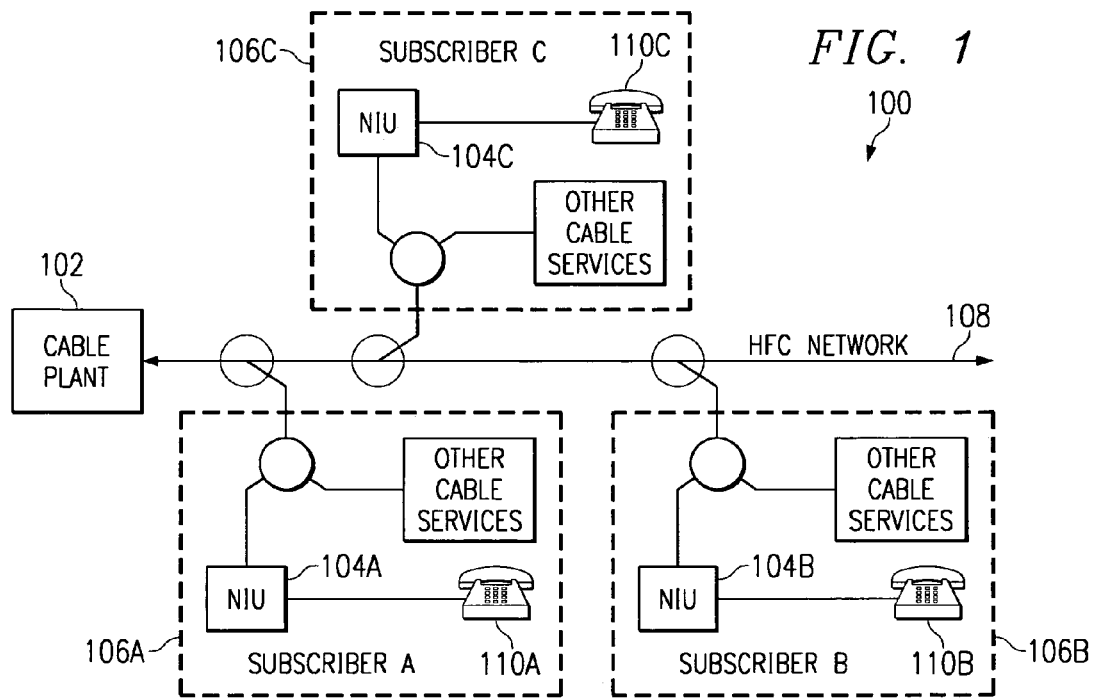
FIG. 1 is a high level block diagram of a cable system set up for cable telephony.

FIG. 1 is a high level block diagram of cable system 100 capable of cable telephony. Cable system 100 comprises cable service provider's cable plant 102 connected to subscriber's premises 106A–106C through HFC network 108. HFC network 108 typically comprises fiber-optic cable for the service provider side of the network, and coax cable near and in the subscriber's premises 106A–106C. In cable system 100, the path from the head-end in cable plant 102, through HFC network 108, to a tuner in NIU 104A–104C on subscriber's premises 106A–106C, is typically designed to be used as a broadcast system. This path generally comprises a much higher bandwidth than the bandwidth needed for voice telephony signals to and from subscriber telephony devices 110A–110C. The excess capacity in the system can generally be utilized more efficiently by using time division multiplexing techniques.

Although the present invention comprises the use of TDM in a cable telephone system, the application of TDM to cellular systems will be described briefly herein to illustrate the benefits of TDM. Digital cellular systems may use TDM to send multiple signals on a single channel by confining signals to assigned, non-overlapping portions of time in the time domain. In particular, the time division multiple access ("TDMA") technique allows a channel to be shared among multiple users by assigning time slots to each user. With TDMA, each source generally transmits its signal in bursts that occur only during the time allocated to that signal. Generally, the primary driver for the use of TDMA in cellular systems was to increase a given base station's capacity so that it could handle more calls simultaneously with a limited frequency spectrum allocation. Voice is generally highly compressible because, for example, it is full of pauses and redundant information, allowing for simulated full duplex transmission even when using TDMA.

Figure 2:
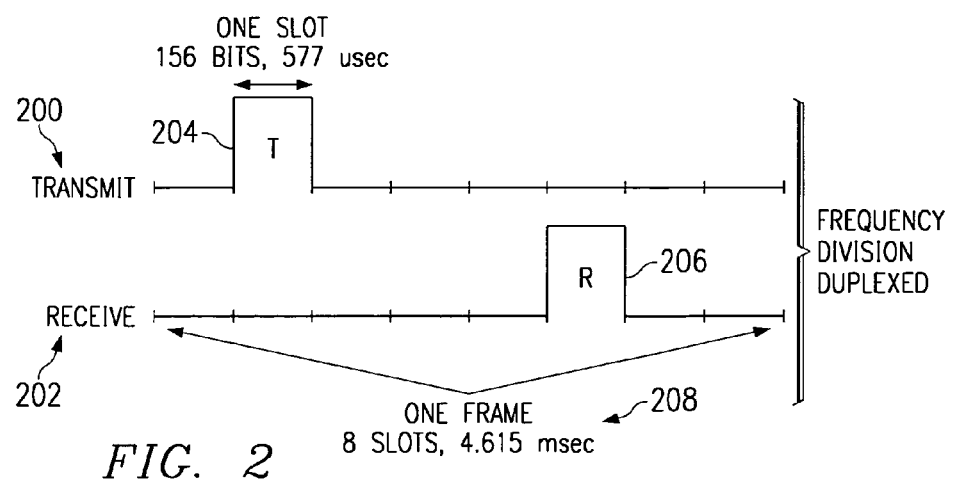
FIG. 2 is a time flow diagram of the transmit and receive signals in a GSM TDM system.

With TDMA, multiple calls using the same spectrum are handled by staggering their use of the spectrum in time. Generally, each of the allocated time periods is called a time slot, and several time slots put together are called a frame. FIG. 2 illustrates an example of TDMA for the Global System for Mobile communications ("GSM") for the European digital cellular telecommunications system, Phase 2, Radio transmission and reception (GSM 05.05), European Telecommunication Standards Institute ("ETSI"), version 4.8.0, Jan. 21, 1994. For transmit channel 200 and receive channel 202, each slot (e.g., transmit slot 204 and receive slot 206) is 577 usec, and 8 slots make up a frame (e.g., frame 208), which is 4.615 msec. In this system, the channel bandwidth is 200 KHz, and the net data rate is 13 kb/s. The frame period generally must be limited in duration so that a simulated full duplex (simultaneous transmission and reception) conversation can occur. In order to properly simulate a full duplex conversation, the frame duration should generally be about 40 msec. or less. A frame duration of 40 msec. is used in the D-AMPS system, which is a U.S. TDMA digital cellular system, Recommended Minimum Performance Standards for 800 MHZ Dual Mode Mobile Stations, EIA/TIA, IS-55, December, 1991. This system is also know as the North American Digital Cellular ("NADC") system.

Another benefit of TDM, and one that is important to a preferred embodiment of the present invention, is that the average power consumption of the subscriber's device may be reduced by allowing the receiver and transmitter to be pulsed on only to receive or transmit, respectively, during the allocated time slots, and turned off the remainder of the time. To achieve significant power savings, however, a Phase Locked Loop ("PLL") with an acquisition time (i.e., time to lock on to the desired frequency) that is short with respect to the period of the allocated time slots is generally required. Assuming that the longest desired frame period is about 40 milliseconds, then a tuner for handling a cable telephony application must have an acquisition time that is significantly less than 40 msec. in order to take advantage of the pulsing to reduce average power consumption. That is, the tuner should generally have a short enough acquisition time so that the tuner can be pulsed off for a significant portion of the frame period.

Traditionally, however, tuners generally have too long of an acquisition time to support a pulse mode operation to save on average power consumption. Acquisition time is also known as lock-in time and lock up time. Conventional tuner modules generally have an acquisition time of 30 to 150 milliseconds. For example, the Philips UV1336 MK2 has an acquisition time of 150 msec. (UV1336 MK2 VHF/UHF television tuner, Preliminary Data Sheet, Philips, Aug. 24, 1998), while the Panasonic CT-10 TSGPR has an acquisition time of 30 msec. (U/D Converter CT-10 TSGPR (for ATV), Tentative Specification, Panasonic, Jun. 16, 1998).

Conventional tuners typically do not have fast acquisition times because the required synthesizer step size for proper tuning is typically 62.5 KHz or smaller for telephony and video. To minimize the price of the tuner, a low-cost integer-N synthesizer is traditionally used. This generally means that the reference comparison frequency is also 62.5 KHz or smaller. The loop bandwidth of the PLL is generally set to about $\frac{1}{100}^{th}$ of the reference frequency to provide sufficient suppression of the reference spurs. Thus the loop bandwidth of PLLs traditionally used for tuners is generally around 625 Hz, and the reference comparison frequency is 62.5 KHz. The acquisition time for an integer-N synthesizer with a small step size, however, is generally too long to permit power savings through pulsing.

As an example, the Panasonic CT-10 TSGPR has a 30 msec. acquisition time so theoretically the tuner could be pulsed off for 10 msec. out of every 40 msec., for a theoretical average power consumption that is about 75% of the instantaneous consumption. In a practical example, of course, the information in the slot itself occupies some finite time period, so the actual pulsed off time will be less than the theoretical amount, making the actual average power consumption slightly higher than the theoretical value. The CT-10 TSGPR has an instantaneous consumption of 2.5 Watts (see U/D Converter CT-10 TSGPR (for ATV), Tentative Specification, Panasonic, Jun. 16, 1998), so the minimum average power dissipation in a pulsed system would be 1.875 Watts. For the Philips UV1336 MK2, it is not possible to pulse the receiver because the tuner's acquisition time is longer than the 40 msec. frame period. The average power dissipation and instantaneous power dissipation are therefore equal at around 0.5 Watts (see UV1336 MK2 VHF/UHF television tuner, Preliminary Data Sheet, Philips, Aug. 24, 1998).

In contrast to conventional tuners, the tuners in MICROTUNER™ family, available from Microtune, Inc., Plano, Tex., utilize either a multiple loop PLL architecture or a fractional-N architecture so that the reference comparison frequency is much higher than the step size (typically 5.25 MHz). A multiple loop PLL architecture is described in commonly assigned U.S. Pat. No. 5,847,612, INTERFERENCE-FREE BROADBAND TELEVISION TUNER, issued Dec. 8, 1998, and commonly assigned and co-pending U.S. patent application Ser. No. 08/904,907, BROADBAND FREQUENCY SYNTHESIZER, filed Aug. 1, 1997, both of which are incorporated herein by reference.

These applications describe tuners incorporating frequency synthesizers with fine resolution (i.e., small step size) and broad phase lock loop bandwidths for the reference comparison signals. An example of conversion circuit 300 discussed in these applications is provided in FIG. 3, in which multiple PLL circuits are used to drive voltage controlled oscillators ("VCO"s) in order to generate the local oscillator ("LO") reference signals for a dual mixer conversion circuit. In a preferred embodiment, conversion circuit 300 may be used in a cable telephony NIU. In addition, conversion circuit 300 may be implemented completely or substantially on a single integrated circuit. A tuner that is constructed on a integrated circuit substrate is disclosed in commonly assigned U.S. Pat. No. 5,737,035, HIGHLY INTEGRATED TELEVISION TUNER ON A SINGLE MICROCIRCUIT, issued Apr. 7, 1998, and commonly assigned and co-pending U.S. patent application Ser. No. 08/904,908, BROADBAND INTEGRATED TELEVISION TUNER, filed Aug. 1, 1997, both of which are incorporated herein by reference. While the specific tuner circuits are at times described with respect to the processing television signals, the actual information content of the signals may be varied, and the tuners may be used to receive and process signals in other radio frequency bands, such as telephony signals transmitted and received via a cable telephony system.

Conversion circuit 300 has dual mixers 302 and 304 which receive LO signals LO1 and LO2 on lines A and B from local oscillator circuit 330. The received RF signals pass through a front-end filter 306. In the prior art, filter 306 usually was a bandpass tracking filter that allowed only a narrow range of frequencies to pass. In this circuit, filter 306 is a low pass filter that is designed to remove all frequencies above an input cutoff frequency. The input cutoff frequency is chosen to be higher than the frequencies of the channels in the television band. The output of filter 306 then passes through amplifier 301 to adjust the signal level that is provided to mixer 302. When conversion circuit 300 is used in a receiver circuit, amplifier 301 may be an automatic gain control ("AGC") amplifier that is adjusted to maintain an overall receiver gain. Following amplifier 301, the RF signal is provided to mixer 302 where it is mixed with a local oscillator signal LO1 from local oscillator circuit 330. The output of mixer 302 is first intermediate frequency signal IF1. Typically, the frequency of LO1 is variable and will be selected based upon the channel in the RF signal that is being tuned. LO1 is selected so that the mixing of LO1 and RF in mixer 302 generates an IF1 signal either at a specified frequency or within a narrow range of frequencies.

Following mixer 302, IF filter 303 is a band pass filter that is used to remove unwanted frequencies and spurious signals from the IF1 signal. The band of frequencies that are passed by filter 303 is a matter of design choice depending upon the IF1 frequency selected in each particular conversion circuit. In this circuit, IF filter 303 is centered at 1090 MHZ and has a 14 MHZ pass band. This allows the selected IF1 frequency to vary within 1083–1097 MHZ. Mixer 304 receives both the filtered IF1 signal from filter 303 and a second local oscillator signal (LO2) from oscillator circuit 330. These signals are mixed to generate a second intermediate frequency (IF2) at the output of mixer 304. In the preferred embodiment, mixer 304 is an image rejection mixer that rejects image frequencies from the IF2 signal. LO2 may be a variable or fixed frequency depending upon whether IF1 is at a fixed frequency or if it varies over a range of frequencies. In either case, the frequency of LO2 is selected to generate a fixed frequency IF2 signal. The IF2 signal is provided through amplifier/buffer 305 to additional processing circuitry (not shown) to generate either digital or analog signals. In this circuit, the frequency of IF2 is selected to be 45.75 MHZ. The output of amplifier 305 is also provided to coherent oscillator circuit ("COHO") 340. COHO 340 creates two reference signals for signal detection.

LO1 is generated in local oscillator circuit 330 by PLL1 332 and LO2 is generated by PLL2 334. PLL3 336 and PLL4 338 provide reference inputs to PLL2 334. A two-wire serial interface, in this case I$^2$C 320, controls local oscillator circuit 330 and causes PLL1-4 332–338 to select the correct LO1 and LO2 frequencies. Local oscillator circuit 330 receives reference signals from oscillator 322 and reference frequency generator 323. Oscillator 322 provides a 5.25 MHZ output based on crystal 321. Frequency generator 323 divides the 5.25 MHZ signal from oscillator 322 to generate additional reference signals at other frequencies.

In a tuner circuit, the acquisition time is generally inversely proportional to the loop bandwidth. This generally allows for a faster acquisition time due to both the higher update rate in the loop as well as wide loop bandwidths up to 1 kHz or 10 kHz or higher. Alternatively, narrower loop bandwidths may be used if a longer acquisition time is practical for a given application. A tuner in the MICROTUNER™ family typically has an acquisition time of under 1 msec. Using a tuner with this type of acquisition characteristic, of which the MICROTUNER™ is the only known example, it is possible to construct an NIU with receiver pulsing capabilities that has an average power dissipation of only about 140 mW (for a MICROTUNER™ having an instantaneous power dissipation of 3.5 Watts). Thus the average power dissipation achieved with the TDM pulsing technique and a fast-acquisition-time tuner is much smaller than that possible with any prior art tuner.

In a preferred embodiment, a MICROTUNER™ MT2000 tuner, having a 1 msec. acquisition time and 3.5 Watts instantaneous power dissipation, is employed in a cable telephony NIU to enable significantly reduced average power dissipation operation during a power outage. In a preferred embodiment, during normal operation (i.e., no power outage), pulsing and TDMA generally are not necessary, and the NIU may operate in Continuous Wave ("CW") mode wherein the tuner is always on to support maximum data rates for video (e.g. television), data (e.g. Internet access), and telephony. When an interruption in power occurs at the subscriber's premises, it is detected by the NIU which begins to draw its power from the storage batteries in the cable plant. The NIU slows down or halts any video or data service (e.g., that is incompatible with pulsing), and sends a message back to the Head-End or Cable Modem Termination System ("CMTS") informing it of the power outage. To conserve power, the Head-End or CMTS will then alter the method of transmitting data in a Lifeline telephony channel. Lifeline telephony channels may be prearranged or dynamically allocated depending on the sophistication of the system. Alternatively, telephone service could always be TDM.

After a brief synchronization period, the Head-End or CMTS begins to send data in slots as described in the cellular telephony TDMA example. In the case of cable telephony, however, the propagation medium is HFC and/or coaxial cable rather than free space as with cellular telephony. Also, cellular telephony systems only have a single mode of operation, i.e., pulsed using TDMA, whereas the present invention may utilize both CW and pulsed modes to optimize the overall service requirements for cable telephony. In standard operation for a phone-only system, the tuner could always be pulsed in order to reduce power.

Figures 3, 4:
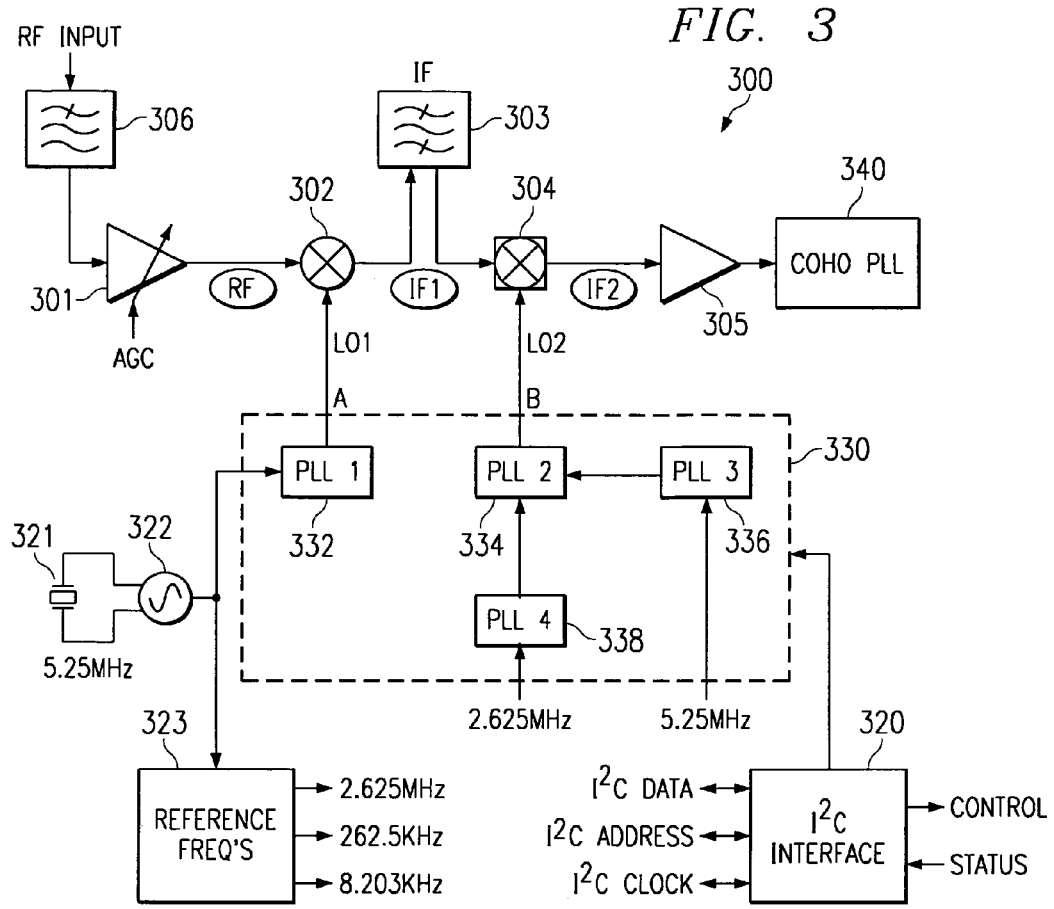
FIG. 3 is a block diagram of a fast-acquisition-time tuner for use in an NIU of the present invention.
FIG. 4 is a chart of the potential power savings achieved by cellular and cable telephony systems utilizing pulsed receivers and TDM.

FIG. 4 illustrates table 406 showing various parameters/power savings 400 possible through the use of pulsed receivers and TDMA, as applied to cellular 402 and cable 404 telephony. The parameters for cable telephony example are assumed based on desirable system performance. For example, a large number of slots/frame (in this case 64) provides for high power savings (in this case about 95.9% over CW).

A channel bandwidth of 375 KHz was selected in the preferred embodiment so that the one way delay time of a reasonably sized cable plant is small compared with the slot duration. This makes synchronization of the communication with the NIU easier but should not be viewed as a requirement of the present invention. If a wider channel bandwidth is used with more slots per frame such that the one way delay time of a reasonably sized cable plant is similar to or greater than the slot duration, then it should be readily apparent to one skilled in the art that the system can still be made to operate but the synchronization generally will become more difficult. Thus, it is envisioned that the channel bandwidth may be chosen to be different than the example shown in FIG. 4. Similarly, the frame duration, slots per frame, modulation type, total bit rate, bit rate per slot, and net bit rate can be chosen differently, and such choices will be obvious to one skilled in the art and are within the scope of the present invention.

In addition, by using a wider channel bandwidth, but without using any (or many) more slots per frame, it is possible to use code division multiple access ("CDMA") techniques in concert with the preferred embodiment so that the signal is spread using orthogonal code sequences. This might allow more efficient use of the overall spectrum as will be readily apparent to one skilled in the art.

Depending on the type of modulation scheme used, the demodulator that follows the tuner in the NIU may have an acquisition time that is a significant fraction of the frame duration. If this is the case, then the tuner should generally be turned on for any preamble or training sequence needed by the demodulator. Alternatively, if the modulation type and demodulator are capable of supporting a period of inactivity in the tuner, then it may be possible to take full advantage of the tuner pulsing technique. Alternatively, an NIU implementing the pulsing technique may have the capability of switching to a different modulation type during power outage. This modulation type generally would not require as long for the demodulator to acquire the signal and would also be supported by the head-end or CMTS. Alternatively, the tuner may output a synchronization signal in a lower power mode such that the demodulator stays locked.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A cable telephony network interface unit (NIU), said NIU comprising:
a radio frequency (RF) cable input for receiving RF telephony signals, wherein said telephony signals comprise a time division multiplexed (TDM) RF signal having a frame rate and a corresponding frame period;
an RF tuner for processing said TDM RF signal, wherein said tuner has an acquisition time of less than half of said frame period, whereby said tuner is pulsed on for signal acquisitions, and pulsed off between signal acquisitions, and wherein said acquisition time is a time to lock on to a desired frequency; and
a voice telephony device compatible output for providing an output from said tuner to a telephony device,
wherein said RF telephony signals further comprise a continuous wave (CW) signal, and said tuner is capable of processing said CW signal, and wherein said NIU receives electrical power via said cable input when said tuner is processing said TDM RF signal and receives electrical power from a different source when processing said CW signal.

2. The NIU of claim 1, wherein said acquisition time is less than one-fourth of said frame period.

3. The NIU of claim 1, wherein said acquisition time is less than about 5 milliseconds.

4. The NIU of claim 1, wherein said acquisition time is less than about 1 millisecond.

5. The NIU of claim 1, wherein said tuner comprises fractional-N generated local oscillator reference frequency signals.

6. The NIU of claim 5, wherein said tuner comprises multiple phase locked loops (PLLs) generating said tuner's local oscillator reference frequency signals.

7. The NIU of claim 6, wherein said PLLs comprise a wide loop bandwidth.

8. The NIU of claim 7, wherein said wide loop bandwidth is greater than said reference frequencies.

9. The NIU of claim 7, wherein said wide loop bandwidth is greater than about 1 KHz.

10. The NIU of claim 1, wherein said TDM is time division multiple access (TDMA).

11. The NIU of claim 1, wherein said TDM RF signal is further multiplexed using code division multiple access (CDMA).

12. The NIU of claim 1, wherein said tuner comprises components, and most of said tuner's components are located on a single integrated circuit.

13. The NIU of claim 1, further comprising a demodulator interposed between said voice telephony device compatible output and said tuner.

14. The NIU of claim 13, wherein said demodulator demodulates according to a first modulation type when said NIU receives electrical power from an external source, and switches to demodulating according to a second modulation type when said NIU receives power via said cable input.

15. A method for processing cable telephony signals, said method comprising:
   receiving a time division multiplexed (TDM) RF cable signal from a cable input, said TDM RF signal comprising frames having time slots;
   pulsing on a fast acquisition time tuner for an allocated time slot in each of said frames, said tuner for processing said TDM RF signal, and wherein said acquisition time is a time to lock on to a desired frequency;
   pulsing off said tuner for substantially the remainder of time in each of said frames, said frames having a frame period, wherein said acquisition time is less than one-fourth of said frame period, and wherein said frame period is equal to the time between the beginning of a first allocated time slot and the beginning of a second allocated time slot;
   wherein said TDM RF signal is received during a loss of a power from an external source; and
   receiving power from said cable input during said loss of power from said external source.

16. The method of claim 15, further comprising sending an alert signal to a cable plant after said loss of power from said external source, to inform said cable plant of said loss of power.

17. The method of claim 15, further comprising:
   receiving and processing a continuous wave (CW) RF cable signal before said loss of power; and
   switching to said receiving of said TDM RF cable signal after said loss of power.

18. The method of claim 15, wherein said TDM is time division multiple access (TDMA).

19. The method of claim 15, wherein said TDM RF signal is further multiplexed using code division multiple access (CDMA).

20. The method of claim 15, wherein said acquisition time is less than about 5 milliseconds.

21. The method of claim 15, wherein said acquisition time is less than about 1 millisecond.

22. The method of claim 15, wherein said tuner comprises fractional-N generated local oscillator reference frequency signals.

23. The method of claim 22 further comprising generating said tuner's local oscillator reference frequency signals with multiple phase locked loops (PLLs).

24. The method of claim 23, wherein said PLLs comprise a wide loop bandwidth.

25. The method of claim 24, wherein said wide loop bandwidth is greater than said reference frequencies.

26. The method of claim 24, wherein said wide loop bandwidth is greater than about 1 KHz.

27. The method of claim 15, further comprising demodulating an output signal from said tuner.

28. The method of claim 27, further comprising demodulating according to a first modulation type when electrical power is received from an external source, and switching to demodulating according to a second modulation type when electrical power is received via said cable input.

29. A cable telephony tuner, said tuner comprising:
   means for receiving a time division multiplexed (TDM) RF cable signal from a cable input, said TDM RF signal comprising frames having time slots;
   means for pulsing on a fast acquisition time tuner for an allocated time slot in each of said frames, said tuner for processing said TDM RF signal wherein said acquisition time is a time to lock on to a desired frequency;
   means for pulsing off said tuner for substantially the remainder of time in each of said frames, said frames having a frame period, wherein said fast acquisition time tuner is operable to lock on to said TDM RF signal in a time equal to or less than a quarter of a time period between consecutive said allocated time slots; and
   means for receiving power from said cable input during a loss of power from an external source, wherein said TDM RF signal is received during said loss of power from said external source.

30. The tuner of claim 29, further comprising means for sending an alert signal to a cable plant after said loss of power from said external source, to inform said cable plant of said loss of power.

31. The tuner of claim 29, further comprising:
   means for receiving and processing a continuous wave (CW) RF cable signal before said loss of power; and
   means for switching to said receiving of said TDM RF cable signal after said loss of power.

32. The tuner of claim 29, wherein said TDM is time division multiple access (TDMA).

33. The tuner of claim 29, wherein said tuner comprises fractional-N generated local oscillator reference frequency signals.

34. The tuner of claim 33 further comprising generating said tuner's local oscillator reference frequency signals with multiple phase locked loops (PLLs).

35. The tuner of claim 34, wherein said PLLs comprise a wide loop bandwidth.

36. The tuner of claim 35, wherein said wide loop bandwidth is greater than said reference frequencies.

37. The method of claim 35, wherein said wide loop bandwidth is greater than about 1 KHz.

38. A method for providing lifeline support in cable telephony, said method comprising:
   receiving electrical power from an external power source;
   receiving a continuous wave (CW) RF cable signal from a cable input;
   processing said CW RF signal with an RF tuner;
   losing power from said external power source;
   switching to receive said electrical power from said cable input;
   receiving a TDM RF telephony signal in place of said CW RF signal, said TDM RF signal comprising frames have time slots; and
   pulsing said tuner on during an allocated time slot in each of said frames and off for substantially the remainder of each of said frames, whereby power consumption by said tuner is significantly reduced when said external power is lost.

39. The method of claim 38, further comprising sending an alert signal to a cable plant after losing said external power to inform said cable plant of said external power loss.

40. The method of claim 38, wherein said CW RF signal comprises video, data and voice information.

* * * * *